United States Patent
Iwata et al.

(10) Patent No.: US 6,708,025 B2
(45) Date of Patent: Mar. 16, 2004

(54) AUTOMATIC GAIN CONTROL METHOD AND APPARATUS, AND RADIO COMMUNICATIONS APPARATUS HAVING AUTOMATIC GAIN CONTROL FUNCTION

(75) Inventors: Yasushi Iwata, Hamamatsu (JP); Yasufumi Ichikawa, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 608 days.

(21) Appl. No.: 09/788,214

(22) Filed: Feb. 16, 2001

(65) Prior Publication Data
US 2001/0044287 A1 Nov. 22, 2001

(30) Foreign Application Priority Data
Feb. 18, 2000 (JP) .................................... P. 2000-041334

(51) Int. Cl.[7] ................................................ H04B 1/06
(52) U.S. Cl. ................ 455/234.1; 455/232.1; 455/245.1; 455/126; 330/279
(58) Field of Search .................. 455/234.1, 232.1, 455/245.1, 250.1, 251.1, 572, 574, 126, 239.1; 330/278, 279, 282, 285, 129, 134, 289; 375/345, 346

(56) References Cited

U.S. PATENT DOCUMENTS

| | | | | |
|---|---|---|---|---|
| 5,687,195 A | * | 11/1997 | Hwang et al. | ............... 375/345 |
| 5,896,064 A | * | 4/1999 | Kaku | ........................... 330/279 |
| 6,060,950 A | * | 5/2000 | Groe | ........................... 330/279 |
| 6,229,397 B1 | * | 5/2001 | Miura | ......................... 330/289 |
| 6,242,982 B1 | * | 6/2001 | Ibelings et al. | ............. 330/279 |
| 6,278,750 B1 | * | 8/2001 | Yu | .............................. 375/345 |
| 6,392,479 B2 | * | 5/2002 | Miura | ......................... 330/129 |

FOREIGN PATENT DOCUMENTS
JP            11-88083      3/1999

\* cited by examiner

*Primary Examiner*—Sonny Trinh
(74) *Attorney, Agent, or Firm*—Pearne & Gordon LLP

(57) ABSTRACT

At the power-on, a determination section (9) outputs a switch control signal (m) to a selector switch (7) to select the output of a sweep signal generator (6) which generates a voltage sweep signal (h) that increases from the minimum value to the maximum value of the gain control voltage range (p) at the same time, then provides the voltage sweep signal (h) to the variable gain amplifier (1), and calculates the difference (f) between the level detection value of an output signal (c) and a convergence value (e) and detects a sweep voltage value (j) obtained when (f)=0 and stores the sweep voltage value (j) into memory. After the sweep operation, the sweep voltage value (j) stored in memory is provided as a gain control signal (b) to the variable gain amplifier (1). Then the primary automatic gain control via the closed loop control system is started.

12 Claims, 11 Drawing Sheets

AUTOMATIC GAIN CONTROL METHOD AND APPARATUS, AND RADIO COMMUNICATIONS APPARATUS HAVING AUTOMATIC GAIN CONTROL FUNCTION

BACKGROUND OF THE INVENTION

The present invention relates to an automatic gain controller and an automatic gain control method for outputting the input signal, whose level varies, in a manner that the input signal is made constant via feedback loop, and radio communications apparatus having the automatic gain control function.

The automatic gain control, typically abbreviated as AGC, has been implemented in a variety of signal processors. For example, in radio communications, the signal level of a received signal varies due to fading in a radio propagation path. Thus the receiving system of radio communications apparatus is equipped with an automatic gain control function in order to make constant the level of the received signal and to reduce demodulation errors.

In automatic gain control, it is desired that pull-in operation can be made in an early stage after power-on. For example, some of the radio communications apparatus that uses a battery as a power supply performs intermittent reception in order to prolong service life of the battery. In such radio communications apparatus, power-on/off is frequently repeated so that the request for reduction of the initial pull-in time is earnest.

As a technology for reducing the initial pull-in time, the "high-speed AGC circuit" is described in the Japanese Patent Publication No. H11-88083. The "high-speed AGC circuit" according to this conventional example maintains the AGC operation point by controlling the gain control signal of the amplifier via a pulse signal having an arbitrary pulse width at power-on, thus reducing the initial pull-in time.

However, for an aforementioned conventional automatic gain controller, a complicated control was required to reduce the initial pull-in time at power-on. Such a control was only realized by most of the related feature in a hardware configuration. This presented a problem of expansion of the circuit scale.

SUMMARY OF THE INVENTION

The invention, in view of the aforementioned circumstances, aims at providing an automatic gain controller and an automatic gain control method for reducing the initial pull-in time at power-on, and radio communications apparatus having the automatic gain control function.

An automatic gain controller according to the invention is characterized in that the automatic gain controller comprises variable gain amplifying means for variably amplifying an input signal based on a gain control signal to output a signal of a predetermined level, gain control signal generating means for generating an automatic gain control signal based on the difference between the level of the output signal of the variable gain amplifying means and a target value, sweep signal output means for outputting a sweep signal used for scanning across the minimum value and the maximum value of the variable gain range of the variable gain amplifying means, gain voltage value detecting means for detecting the control voltage value of the sweep signal obtained when the level of the output signal has coincided with the target value, and gain control signal supplying means for supplying the sweep signal as a gain control signal to be supplied to the variable gain amplifying means in the initial stage of operation, supplying the control voltage value obtained when the level of the output signal has coincided with the target value after the sweep operation via the sweep signal, and supplying the automatic gain control signal that is based on the difference after output of the control voltage value.

Preferably, the gain control signal supplying means assumes completion of the sweep operation when the sweep signal has traversed across one and the other of the minimum value and the maximum value in the variable gain range, and outputs the control voltage value as the gain control signal on completion of the sweep operation. Or, the gain control signal supplying means stops the sweep operation when the level of the output signal has coincided with the target value, and outputs the control voltage value as the gain control signal on stoppage of the sweep operation.

Preferably, the automatic gain controller comprises start operation control means for determining that the control voltage value of the sweep signal obtained when the level of the output signal has coincided with the target value has fallen within a predetermined control value range of the variable gain range of the variable gain amplifying means, and supplying the median of the control value range as the gain control signal to the variable gain amplifying means at the start of the next operation when the control voltage value has fallen within this control value range a predetermined number of times in succession.

Preferably, the automatic gain controller comprises sweep control means for determining that the control voltage value of the sweep signal obtained when the level of the output signal has coincided with the target value has been biased to one side of the variable gain range of the variable gain amplifying means, and performing sweep operation in the direction opposite to the sweep direction of the sweep signal at the start of the next operation when the control voltage value has fallen within this biased control value range a predetermined number of times in succession.

An automatic gain control method according to the invention is an automatic gain control method for variably amplifying an input signal based on a gain control signal via the variable gain amplifying means to output a signal of a predetermined level, characterized in that the automatic gain control method comprises a sweep signal supplying step for supplying a sweep signal that scans across the minimum value and the maximum value of the variable gain range of the variable gain amplifying means in the initial stage of operation, a control voltage value supplying step for detecting the control voltage value of the sweep signal obtained when the level of the output signal of the variable gain amplifying means has coincided with the target value and supplying the control voltage value after the sweep operation via the sweep signal, and an automatic gain control signal supplying step for generating an automatic gain control signal based on the difference between the level of the output signal of the variable gain amplifying means and a target value and supplying the automatic gain control signal after output of the control voltage value.

Preferably, the sweep signal supplying step assumes completion of the sweep operation when the sweep signal has traversed across one and the other of the minimum value and the maximum value in the variable gain range, and outputs the control voltage value as the control voltage value supplying step. Or, the sweep signal supplying step stops the sweep operation when the level of the output signal has coincided with the target value, and supplies the control voltage value as the control voltage value supplying step on stoppage of the sweep operation.

Preferably, the automatic gain control method comprises a start operation control step for determining that the control voltage value of the sweep signal obtained when the level of the output signal has coincided with the target value has fallen within a predetermined control value range of the variable gain range of the variable gain amplifying means, and supplying the median of the control value range as the gain control signal to the variable gain amplifying means at the start of the next operation when the control voltage value has fallen within this control value range a predetermined number of times in succession.

Preferably, the automatic gain control method comprises a sweep control step for determining that the control voltage value of the sweep signal obtained when the level of the output signal has coincided with the target value has been biased to one side of the variable gain range of the variable gain amplifying means, and performing sweep operation in the direction opposite to the sweep direction of the sweep signal at the start of the next operation when the control voltage value has fallen within this biased control value range a predetermined number of times in succession.

Radio communications apparatus according to the invention is radio communications apparatus comprising an automatic gain control feature for variably amplifying an input signal based on a gain control signal via the variable gain amplifying means to output a signal of a predetermined level, characterized in that the radio communications apparatus comprises gain control signal generating means for generating an automatic gain control signal based on the difference between the level of the output signal of the variable gain amplifying means and a target value, sweep signal output means for outputting a sweep signal that scans across the minimum value and the maximum value of the variable gain range of the variable gain amplifying means, gain voltage value detecting means for detecting the control voltage value of the sweep signal obtained when the level of the output signal has coincided with the target value, and gain control signal supplying means for supplying the sweep signal as a gain control signal to be supplied to the variable gain amplifying means in the initial stage of the operation, supplying the control voltage value obtained when the level of the output signal has coincided with the target value after the sweep operation via the sweep signal, and supplying the automatic gain control signal that is based on the difference after output of the control voltage value.

Preferably, radio communications apparatus comprises fading pitch detecting means for detecting the fading pitch of the input signal and start operation control means for determining that the control voltage value of the sweep signal obtained when the level of the output signal has coincided with the target value has fallen within a predetermined control value range of the variable gain range of the variable gain amplifying means when the cycle of the detected fading pitch is shorter than a predetermined value, and supplying the median of the control value range as the gain control signal to the variable gain amplifying means at the start of the next operation when the control voltage value has fallen within this control value range a predetermined number of times in succession.

The invention supplies a sweep signal as a gain control signal to be supplied to variable gain amplifying means in the initial stage of operation, detects the control voltage value of the sweep signal obtained when the level of the output signal has coincided with a target value, supplies the control voltage value after the sweep operation, supplies an automatic gain control signal that is based on the difference between the level of the output signal and the target value, then starts and executes automatic gain control. This allows an early pull-in operation at the start of operation, generally at power-on, and allows execution to quickly shift to the primary automatic gain control via a closed loop. Thus it is possible to reduce the initial pull-in time at power-on via a simple configuration without expanding the circuit scale.

In this practice, more preferably, by reducing or making smaller the time constant of the circuit prior to sweep operation via a sweep signal in a level detection circuit such as a detecting circuit for detecting the level of an output signal, a faster pull-in operation is allowed and the accuracy of the automatic control at power-on is upgraded.

When automatic gain control is intermittently performed by turning on/off the power supply, it is determined that the control voltage value of a sweep signal obtained when the level of an output signal has coincided with a target value has fallen within a predetermined control value range of the variable gain range of variable gain amplifying means, and the median of the control value range is supplied to the variable gain amplifying means as a gain control signal at the start of the next operation or power-on in case the control voltage value has fallen within this control value range a predetermined number of times in succession. This further boosts the pull-in operation at the start of operation by using the median of the control value range when the control voltage value remains stable while automatic gain control is being performed intermittently several times.

When automatic gain control is performed intermittently by turning on/off the power supply, it is determined that the control voltage value of the sweep signal obtained when the level of the output signal has coincided with the target value has been biased to one side of the variable gain range of the variable gain amplifying means, and sweep operation is performed in the direction opposite to the sweep direction of the sweep signal at the start of the next operation or power-on when the control voltage value has fallen within this biased control value range a predetermined number of times in succession. For example, in case the control voltage value has fallen within the control value range biased to the maximum value side of the variable gain range a predetermined number of times in succession while a sweep signal is used to scan from the minimum value to the maximum value of the variable gain range of the variable gain amplifying means, the sweep signal is used to scan from the maximum value to the minimum value at the next power-on to supply the sweep signal and to detect the control voltage value obtained when the level of the output signal has coincided with the target value. This further boosts the pull-in operation at the start of operation by reversing the sweep direction in case the sweep start voltage value is distant from the control voltage value as a convergence result obtained when automatic gain control is performed intermittently several times.

When automatic gain control is intermittently performed in the intermittent operation via radio communications apparatus, the fading pitch of an input signal or received signal is detected. Then it is determined that the control voltage value of the sweep signal obtained when the level of the output signal has coincided with the target value has fallen within a predetermined control value range of the variable gain range of the variable gain amplifying means, and the median of the control value range is supplied to the variable gain amplifying means as a gain control signal at the start of the next operation or power-on in case the control voltage value has fallen within this control value range a predetermined number of times in succession. This further boosts the pull-in operation at the start of operation by using the median of the control value range depending on the fading pitch of the reception signal, that is, in case the cycle of the fading pitch is short depending on the receiving state that varies with travel velocity.

In this practice, more preferably, the aforementioned sweep operation is performed at the start of operation in case the power-on cycle or operation cycle of automatic gain control is long or slow, and the median of the control value range is used to perform pull-in operation. This makes it more appropriately feasible to start automatic gain control.

DETAILED DESCRIPTION OF THE PREFERRED EMBODIMENT

Embodiments of the invention will be described below with reference to drawings.

(First Embodiment)

Figure 1:
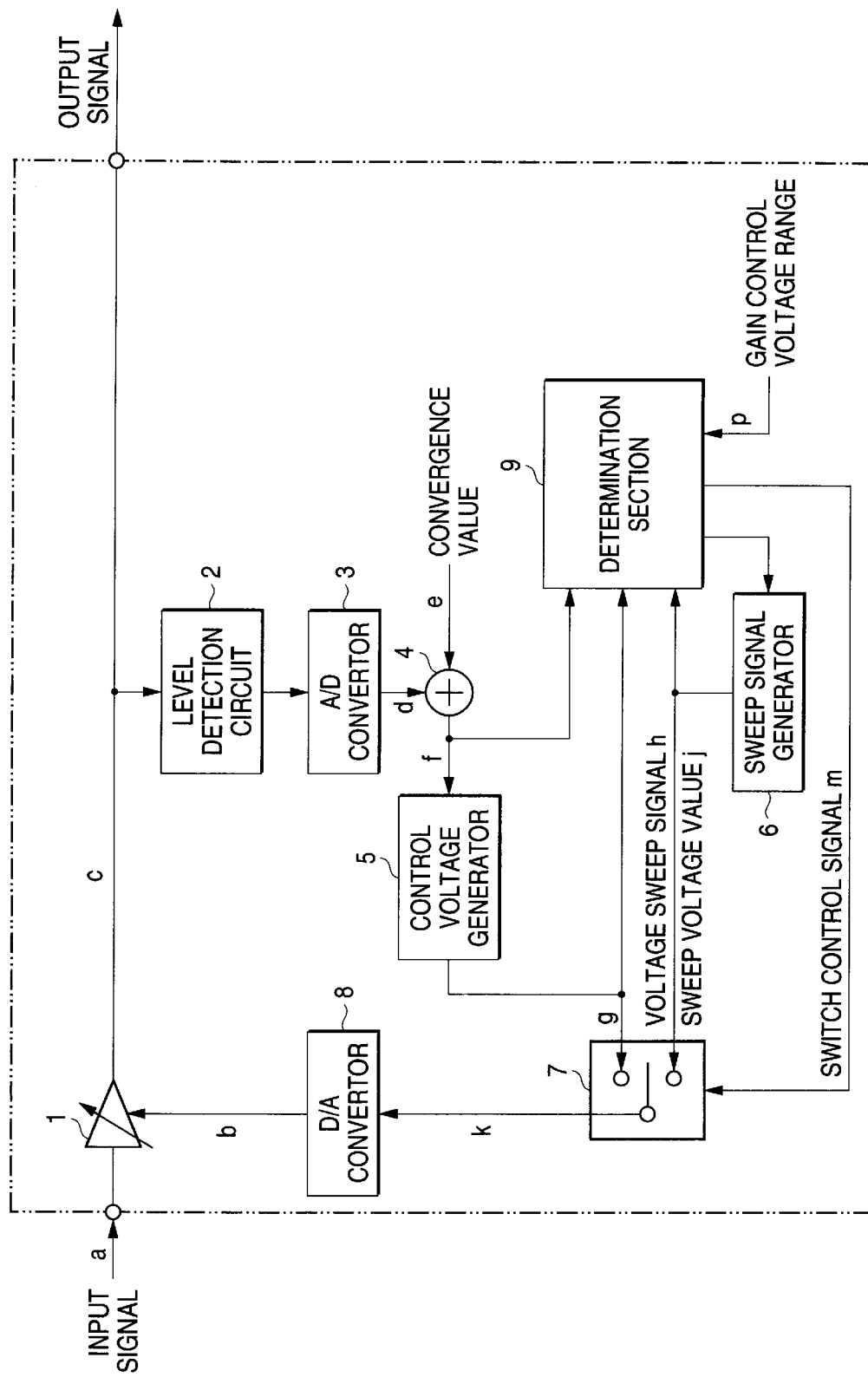
FIG. 1 is a block diagram showing the key configuration of an automatic gain controller according to an embodiment of the invention.

FIG. 1 is a block diagram showing the configuration of an automatic gain controller according to an embodiment of the invention. While this embodiment shows an application to radio communications apparatus, the automatic gain controller can be applied to a variety of signal processors.

An automatic gain controller according to this embodiment comprising a variable gain amplifier 1 (variable gain amplifying means) that variably amplifies an input signal a, such as a received signal, based on a gain control signal b applied to the gain control input, and that outputs the resulting signal to a signal processing system in a subsequent stage. This automatic gain controller has a closed loop control system for generate a gain control signal b based on an output signal c of the variable gain amplifier 1 to perform stabilizing control of the output signal c.

The closed loop control system is equipped with a level detection circuit 2 for detecting the level of the output signal of the variable gain amplifier 1, an A/D converter 3 for digitizing an analog level detection value output from the level detection circuit 2, and an adder 4 (gain control signal generator) for obtaining a difference f between an output level value d output from the A/D converter 3 and a convergence value e that is a control target value input from outside. As for the level detection circuit 2a, a detecting circuit, for example, for detecting the output signal c of the variable gain amplifier 1 via an envelope is used.

The closed loop system is also equipped with a control voltage generator 5 for generating a gain control voltage value g in accordance with the output difference value f, a sweep signal generator 6 for outputting a voltage sweep signal h for sweeping a gain control signal between the minimum value and the maximum value of a gain control voltage range p that corresponds the variable gain range of the variable gain amplifier 1 and a predetermined sweep voltage value j (a control value), a selector switch 7 for selecting and outputting either of the gain control voltage value g and the output signal of the sweep signal generator 6 (a voltage sweep signal h or a sweep voltage j) as a gain control signal k, and a D/A converter 8 for converting the digital gain control signal k output from the selector switch 7 to an analog signal and outputting the analog signal as a gain control signal b to the gain control input of the variable gain amplifier. The closed loop system is also equipped with an determination section 9 configured with a timer, a memory, a counter, and a determination unit, for performing operation control such as output control of the sweep signal generator 6 and switching control of the selector switch 7. This determination section 9 has the features of gain control signal provider, control voltage value detector, starting operation controller, and sweep controller.

Figure 2:
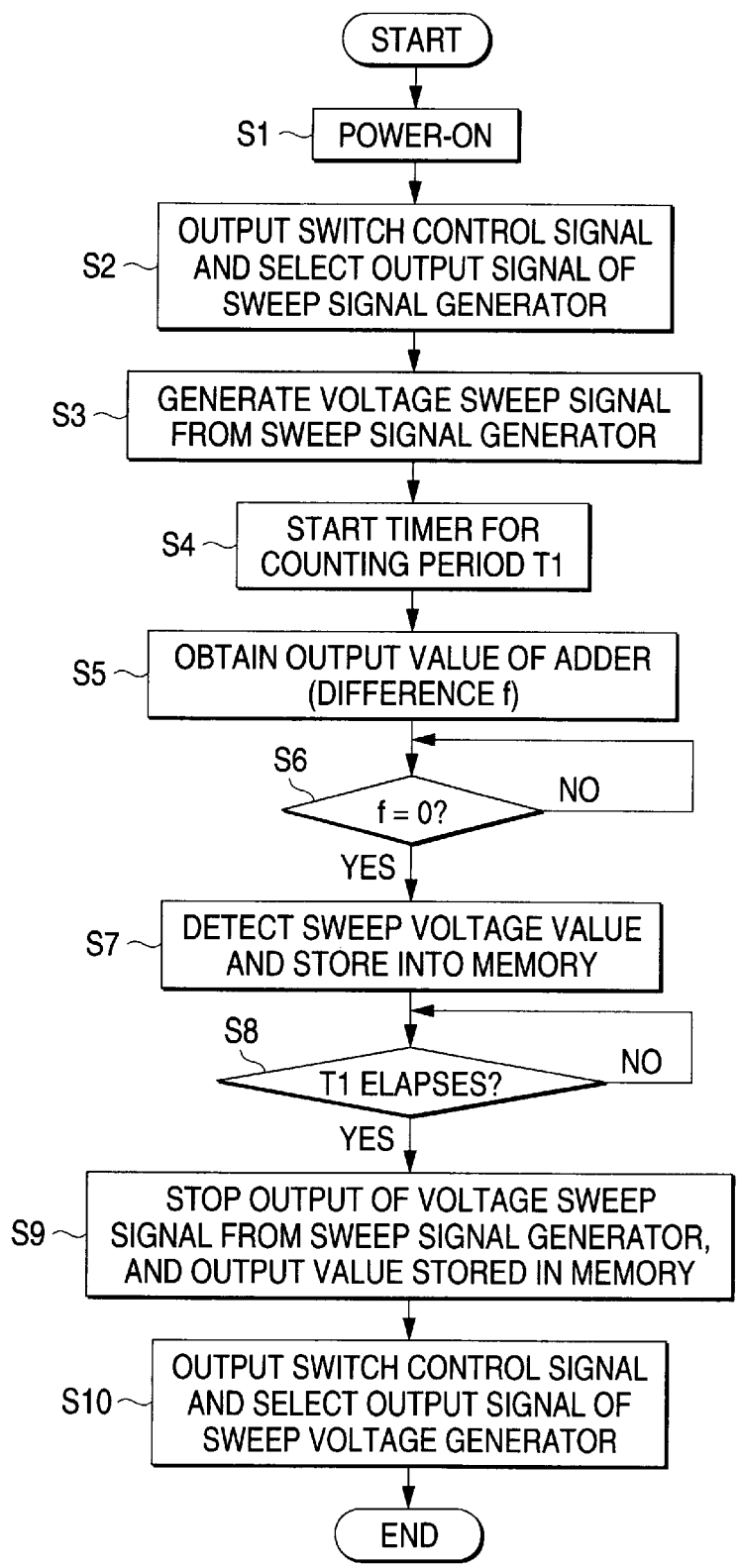
FIG. 2 is a flowchart showing the operation procedure for the first embodiment.
Figure 3:
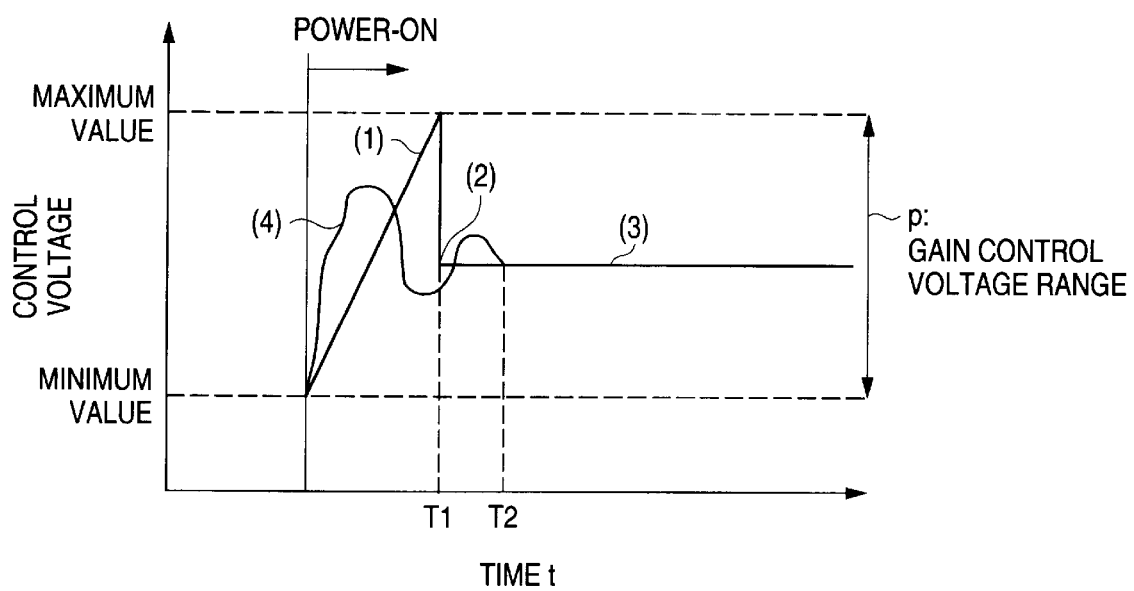
FIG. 3 is a waveform diagram showing the gain control voltage in the operation according to the first embodiment.

Next, the operation of an automatic gain controller according to the first embodiment of the invention will be described. FIG. 2 is a flowchart showing the operation procedure for the first embodiment. FIG. 3 is a waveform diagram showing the gain control voltage in the operation according to the first embodiment.

When the automatic gain controller is powered (step S1), the determination section 9 outputs a switch control signal m to the selector switch 7 and selects the output of the sweep signal generator 6 (step S2). At the same time, the determination section 9 sends an instruction to the sweep signal generator 6 to generate a voltage sweep signal h (step S3) and starts a timer for counting a predetermined period T1 (step S4).

In this practice, the sweep signal generator 6 outputs a voltage sweep signal h for sweeping a gain control voltage range p of the variable gain amplifier 1, so that the voltage value may increase monotonously, or substantially linearly, for example from the minimum value to the maximum value over the period T1. Via this feature, at about the same time as the variable gain amplifier 1 is powered, the voltage sweep signal h is applied to the gain control input as a gain control signal b, and the gain control voltage range p is swept from the minimum value to the maximum value, and the gain varies correspondingly. As a result, a signal obtained by amplifying an input signal a in accordance with the gain corresponding to the value of the voltage sweep signal h is output as an output signal c. The level of the output signal c is detected by a level detection circuit 2, digitized by an A/D converter 3, and input as an output level value d to one input of an adder 4. Then a difference f between the output level value d and a convergence value e input to the other input from a controller (not shown) is calculated. The difference f is sent to a control voltage generator 5 and the determination section 9. The control voltage generator 5 generates a gain control voltage value g corresponding to the difference f and outputs the gain control voltage value g to one input of the selector switch 7 while the selector switch 7 is selecting the output of the sweep signal generator 6.

The determination section 9 obtains the difference f that is an output value from the adder 4 (step S5) and monitors that the difference f becomes 0 (step S6). The difference f of the adder 4 becomes 0 when the output level of the variable gain amplifier 1 coincides with the control target value (convergence value e). This occurs while the voltage sweep signal h sweeps the gain control voltage range p. In case f=0 instep S6, the corresponding voltage value of the voltage sweep signal h (sweep voltage value j) is detected and stored into memory (step S7). Execution enters the wait state until the period T1 has elapsed to cause time-out of the timer, that is, until the voltage sweep signal h has swept up to the maximum value of the gain control voltage range p (step S8).

When the period T1 is elapsed in step S8, an instruction is sent to the sweep signal generator 6 to stop output of the voltage sweep signal h, and the voltage value stored in memory is generated as a sweep voltage value j instead (step S9). Via this feature, the sweep voltage value j obtained when the difference f between the level detection value of the output signal c and the convergence value e is 0 is applied as a gain control signal b, instead of the voltage sweep signal h, to the gain control input of the variable gain amplifier 1. Therefore, after the elapse of the period T1, the variable gain amplifier 1 shifts to an amplifying operation based on a predetermined gain control value.

At about the same time, the determination section 9 outputs a switch control signal m to the switch selector 7 to select the gain control voltage value g output by the control voltage generator 5 (step S10). Via this feature, the gain control voltage value g that is based on the difference f between the level detection value of the output signal c and the convergence value e is applied as a gain control signal b to the gain control input of the variable gain amplifier 1. This starts the primary automatic gain control via the closed loop control system.

In this practice, since the gain control value indicated by the gain control signal b after switching of operation via the selector switch 7 (gain control voltage value g) is a value close to the gain control signal b just before switching (sweep voltage value j), the automatic gain control by this closed loop control system starts and is executed smoothly in a stable manner substantially from the start of the operation.

FIG. 3 shows the gain control voltage at the start of operation according to the aforementioned first embodiment. In the first embodiment, when the apparatus is powered, a voltage sweep signal (1) is applied to the gain control input of the variable gain amplifier 1. The voltage sweep signal (1) varies in the gain control voltage range p so that the signal value may increase from the minimum value of the control voltage to the maximum value of the control voltage along a substantially linear inclination, and reaches the maximum value of the control voltage when the period T1 has elapsed. Via this feature, the gain of the variable gain amplifier 1 is scanned via the voltage sweep signal (1) during the interval T1. After power-on, a state is reached where the output level of the variable gain amplifier 1 becomes identical with the convergence value e. The sweep voltage value of the voltage sweep signal (1) in this state is detected and stored into memory.

After the elapse of the period T1, the sweep voltage value obtained when the difference f between the level detection value of the output signal c and the convergence value e stored in memory is 0 is applied as a gain control voltage (2), instead of the voltage sweep signal (1), and at about the same time, the input signal to the gain control input to the variable gain amplifier 1 is switched. Subsequently, a gain control voltage (3) generated by the control voltage generator 5 and based on the difference f between the level detection value of the output signal c and the convergence value e is applied and the automatic gain control via the closed loop control system is performed.

Thus, in the first embodiment, the gain control value of the variable gain amplifier 1 is swept in the period T1 and the state where the output level of the variable gain amplifier 1 has coincided with the control target value is detected, and the gain control value in the state is passed to the automatic gain control after elapse of the period T1. This assures stable control without fluctuation of the gain control value, from the very beginning of the automatic control.

On the other hand, when automatic gain control is performed based on the difference f between the level detection value of the output signal c and the convergence value e via the closed loop control system right from the start of power-on, the gain control voltage is as shown by (4) in FIG. 3. The gain control voltage undergoes a large variation when the automatic gain control is started and it takes a considerable time before the gain control voltage converges to the control target value. FIG. 3 shows a case where the gain control voltage converges after elapse of the period that is longer than the period T1. By setting the period T1 that is a sweep period of the voltage sweep signal (1) shorter than the period T2 where the gain control voltage converges in this closed loop control system, it is possible to reduce the initial pull-in time at power-on in an automatic gain controller.

Thus, according to the first embodiment, the gain of the variable gain amplifier 1 is swept in the initial pull-in operation at power-on and the gain control voltage where the output level of the variable gain amplifier 1 coincides with the target value is generated in the early stage after power-on to switch to automatic gain control via a closed loop. This reduces the initial pull-in time. In this embodiment, reduction of the initial pull-in time is realized only by adding software processing and requires no additional hardware circuits to perform complicated control for high-speed processing. This allows reduction of the initial pull-in time via a simple configuration without expanding the circuit scale.

(Second Embodiment)

Figure 4:
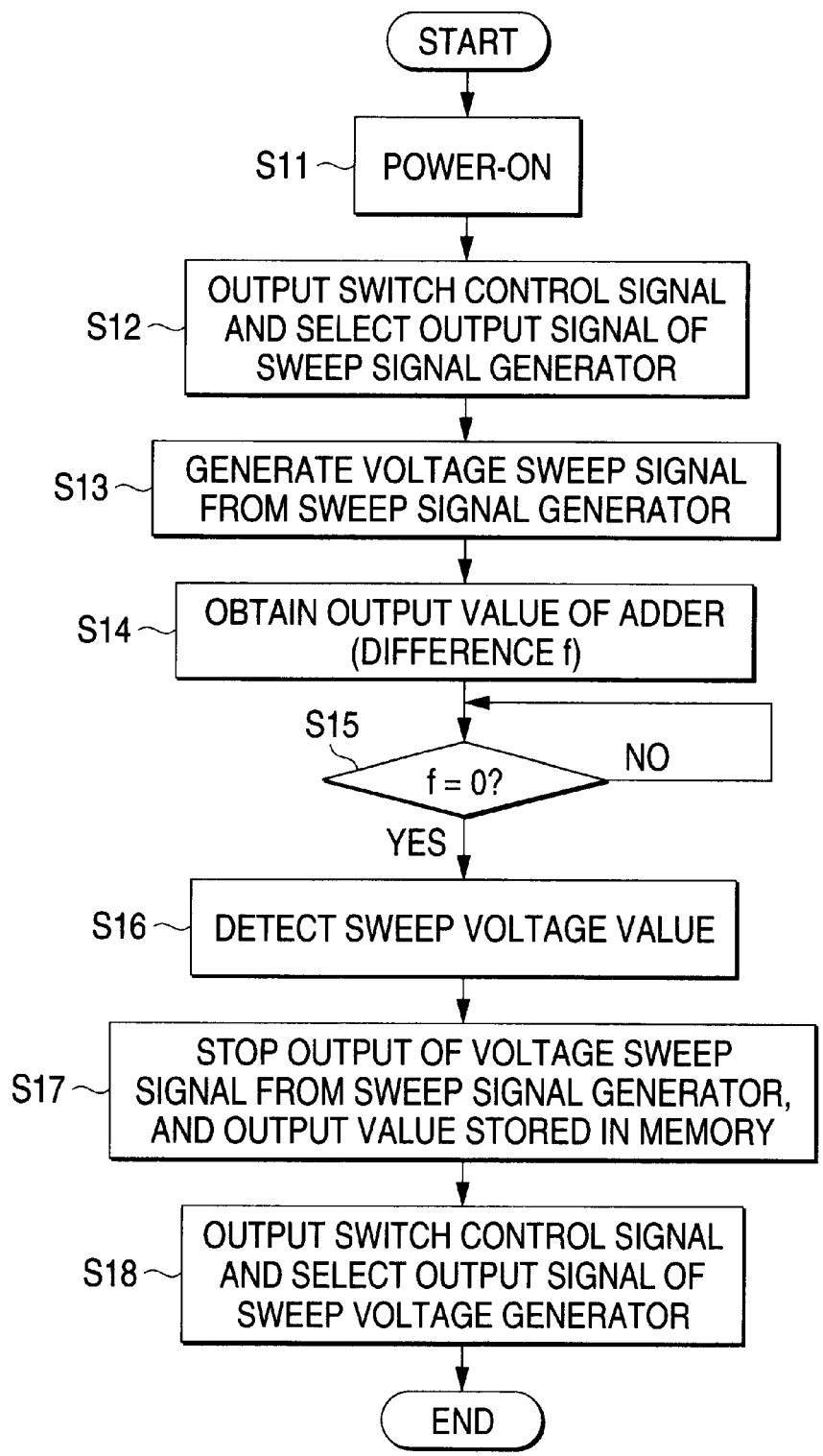
FIG. 4 is a flowchart showing the operation procedure for the second embodiment.
Figure 5:
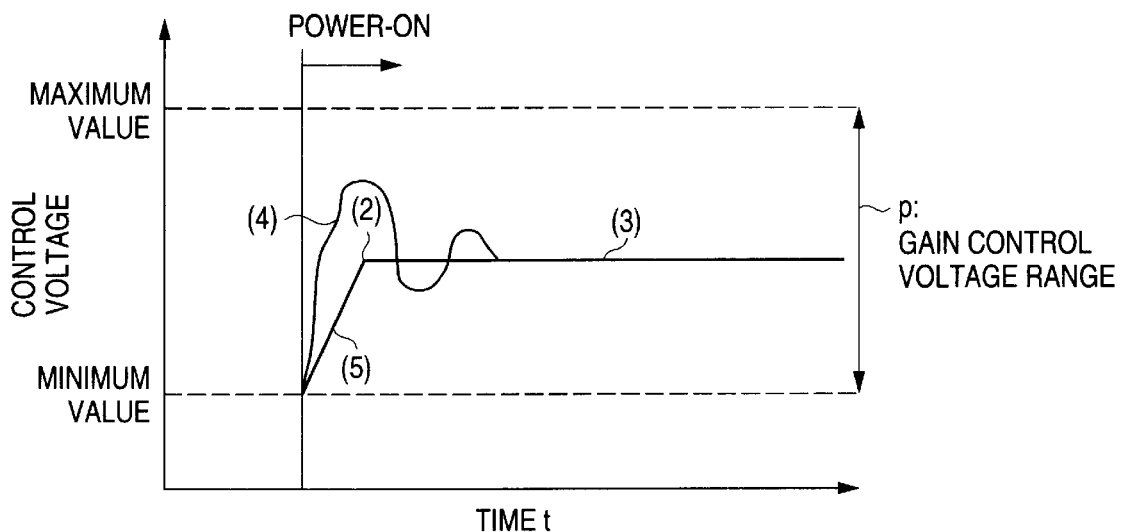
FIG. 5 is a waveform diagram showing the gain control voltage in the operation according to the second embodiment.

FIG. 4 is a flowchart showing the operation procedure for the second embodiment. FIG. 5 is a waveform diagram showing the gain control voltage in the operation according to the second embodiment. Configuration of the automatic gain controller is the same as that of the first embodiment shown in FIG. 1 thus the corresponding description is omitted. For operation, the difference from the first embodiment is mainly described.

When the automatic gain controller is powered (step S11) the determination section 9 outputs a switch control signal m to the selector switch 7 and selects the output of the sweep signal generator 6 (step S12). At the same time, the determination section 9 sends an instruction to the sweep signal generator 6 to generate a voltage sweep signal h (step S13). The determination section 9 obtains the difference f that is an output value from the adder 4 (step S14) and monitors that the difference f becomes 0 (step S15). In case f=0 in step S15, the determination section detects the voltage value of the voltage sweep signal h (sweep voltage value j) (step S16). Then, the determination section 9 immediately sends an instruction to the sweep signal generator 6 to stop output of the voltage sweep signal h, and generates the detected voltage value as a sweep voltage value j instead (step S17). Via this feature, the sweep voltage value j obtained when the difference f between the level detection value of the output signal c and the convergence value e is 0 in the course of a sweep via the voltage sweep signal h is applied as a gain control signal b to the gain control input of the variable gain amplifier 1. Therefore, the variable gain amplifier 1 shifts to an amplifying operation that is based on a predetermined gain control value earlier than the embodiment 1.

At about the same time, the determination section 9 outputs a switch control signal m to the switch selector 7 to select the gain control voltage value g output by the control voltage generator 5 (step S18). Via this feature, the gain control voltage value g that is based on the difference f between the level detection value of the output signal c and the convergence value e is applied as a gain control signal b to the gain control input of the variable gain amplifier 1, same as the first embodiment. This starts the primary automatic gain control via the closed loop control system.

In this practice, since the gain control value indicated by the gain control signal b after switching of operation via the selector switch 7 (gain control voltage value g) is a value substantially equal to the gain control signal b just before switching (sweep voltage value j), the automatic gain control by this closed loop control system starts and is executed smoothly in a more stable manner than in the first embodiment substantially from the start of the operation.

FIG. 5 shows the gain control voltage at the start of operation according to the aforementioned second embodiment. In the second embodiment, when the apparatus is powered, a voltage sweep signal (5) is applied that varies in the gain control voltage range p so that the signal value may increase from the minimum value of the control voltage to the maximum value of the control voltage along a substantially linear inclination to the gain control input of the variable gain amplifier 1, same as the first embodiment.

When the output level of the variable gain amplifier 1 coincides with the convergence value e in the course of a sweep via the voltage sweep signal (5) and the difference being 0 is detected, the then sweep voltage value is immediately given as a gain control voltage (2), instead of the voltage sweep signal (5), to the gain control input of the variable gain amplifier 1. At about the same time, the input signal to the gain control input of the variable gain amplifier 1 is switched. Subsequently, a gain control voltage (3) that is based on the difference f between the level detection value of the output signal c and the convergence value e generated by the control voltage generator 5 is applied and the automatic gain control via the closed loop control system is performed.

On the other hand, when automatic gain control is performed based on the difference f between the level detection value of the output signal c and the convergence value e via the closed loop control system right from the start of power-on, the gain control voltage, as shown by (4) in FIG. 5, undergoes a large variation when the automatic gain control is started and it takes a considerable time before the gain control voltage converges to the control target value.

Thus, in the second embodiment, the gain control value of the variable gain amplifier 1 is swept and the state where the output level of the variable gain amplifier 1 has coincided with the control target value is detected, and the gain control value in the state is immediately passed to the automatic gain control. This assures stable control without fluctuation of the gain control value, from the very beginning of the automatic control. The second embodiment can reduce the initial pull-in time further than the aforementioned first embodiment and shifts to the primary automatic gain control earlier in order to realize stable control.

(Third Embodiment)

Figure 6:
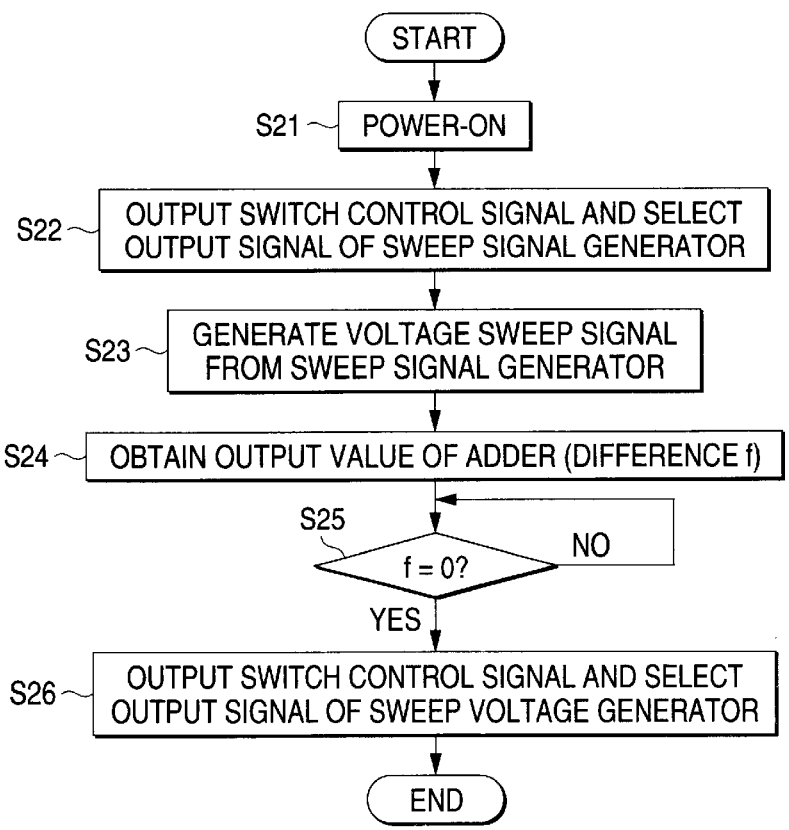
FIG. 6 is a flowchart showing the operation procedure for the third embodiment.

FIG. 6 is a flowchart showing the operation procedure for the third embodiment. Configuration of the automatic gain controller is the same as that of the first embodiment shown in FIG. 1 thus the corresponding description is omitted. For operation, the difference from the first and second embodiments is mainly described.

Same as steps S11 through S15 in FIG. 4, when the automatic gain controller is powered (step S21), the determination section 9 outputs a switch control signal m to the selector switch 7 and selects the output of the sweep signal generator 6 (step S22). At the same time, the determination section 9 sends an instruction to the sweep signal generator 6 to generate a voltage sweep signal h (step S23). The determination section 9 obtains the difference f that is an output value from the adder 4 (step S14) and monitors that the difference f becomes 0 (step S25). In case f=0 in step S25, the determination section outputs the switch control signal m to the selector switch 7 without detecting the swept voltage value, and selects the gain control voltage value g generated by the control voltage generator 5 (step S26). Via this feature, the gain control voltage value g obtained when the difference f between the level detection value of the output signal c and the convergence value e is 0 is applied as a gain control signal b to the gain control input of the variable gain amplifier 1 in the course of a sweep via the voltage sweep signal h. This starts the primary automatic gain control via the closed loop control system.

Thus, in the third embodiment, the gain control value of the variable gain amplifier 1 is scanned. When the output level of the variable gain amplifier 1 has coincided with the control target value, execution shifts to the automatic gain control. This assures stable control without fluctuation of the gain control value, from the very beginning of the automatic control. Thus, same as the second embodiment, it is possible to reduce the initial pull-in time and execute stable control promptly.

(Fourth Embodiment)

Figure 7:
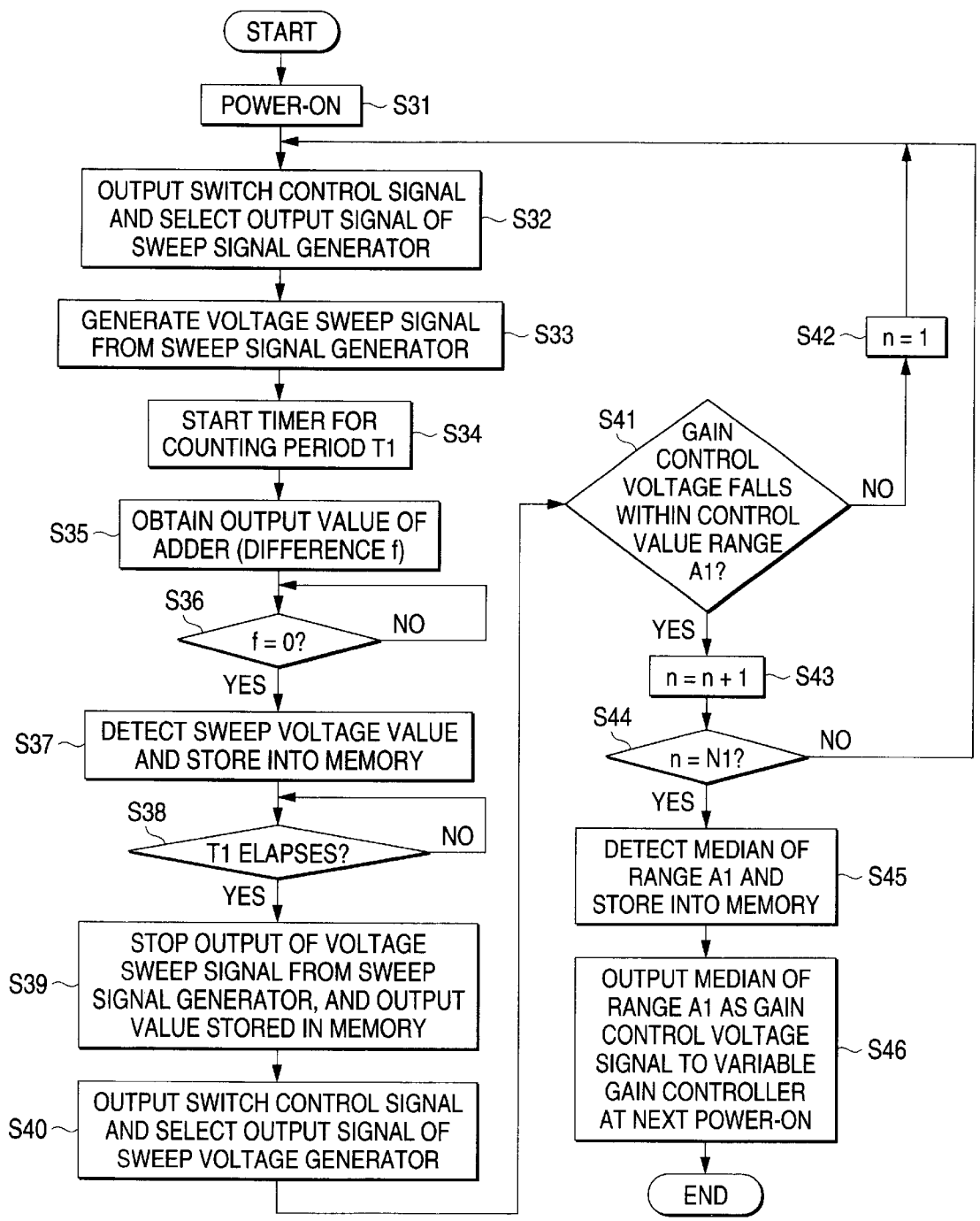
FIG. 7 is a flowchart showing the operation procedure for the fourth embodiment.
Figure 8:
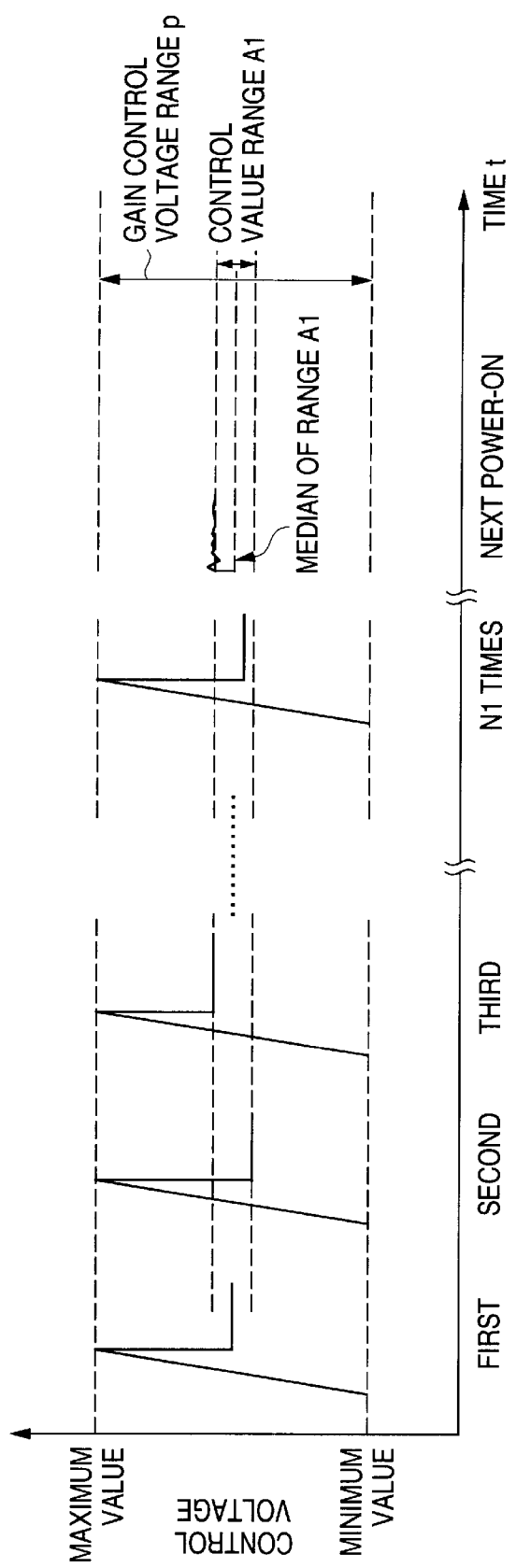
FIG. 8 is a waveform diagram showing the gain control voltage in the operation according to the fourth embodiment.

FIG. 7 is a flowchart showing the operation procedure for the fourth embodiment. FIG. 8 is a wave form diagram showing the gain control voltage in the operation according to the fourth embodiment. Configuration of the automatic gain controller is the same as that of the first embodiment shown in FIG. 1 thus the corresponding description is omitted. For operation, the difference from the first embodiment is mainly described.

In FIG. 7, the processing in steps S31 through S40 is the same as steps S1 through S10 in the first embodiment shown in FIG. 1. That is, automatic gain control is started via the same procedure as the first embodiment from power-on of the automatic gain controller until execution shifts to the primary gain control via the closed loop.

After automatic gain control is started in step S40, the determination section 9 determines whether or not the gain control voltage value g output from the control voltage generator 5 has fallen within the predetermined control value range A1 (step S41). This predetermined control value range A1 is set as required based on for example the gain control voltage value g obtained when the adder 4 has output f=0 in the gain control voltage range p input from the controller (not shown). Thus the predetermined control value range A1 is set in the predetermined area of the gain control voltage range p depending on the convergence value e.

In case the gain control voltage value g does not fall within the control value range A1 in step S41, execution proceeds to step S42 and sets the counter value n of the counter in the determination section 9 to n=1 then returns to step S32. Processing on the initial pull-in operation of the automatic gain control is performed again and the gain control voltage value g is determined in step S41.

In case the gain control voltage value g has fallen within the control value range A1 in step S41, the counter value n of the counter is increased by one, that is, n=n+1 (step S43) and it is determined whether or not the counter value n=N1 (step S44). In case N is not N1, that is, the gain control voltage value g as a convergence result at the start of automatic gain control is within the control value range A1 less than N1 times, execution returns to step S32 and the same processing is repeated. That is, the counter in the determination section 9 is increased when the gain control voltage value g has converged within the control value range A1 in succession. In case the gain control voltage value g is out of the control value range A1, counting restarts from n=1 again.

In case n=N1 in step S44 and the gain control voltage value g has converged within the control value range A1 N1 times in succession, the median of the control value range A1 is detected and this value is stored into memory (step S45). The determination section 9 determines that the gain control voltage value g has fallen within the control value range A1 stably, when the gain control voltage value g as a convergence result has fallen within the predetermined control value range A1 a predetermined number of times (N1 times) in succession while pull-in operation of the automatic gain control is intermittently being performed, and stores the median of the control value range A1 into memory.

At the next power-on, the determination section 9 generates the median of the control value range A1 obtained via the aforementioned procedure as a sweep voltage value j and outputs the median as a gain control signal b to the variable gain amplifier 1 (step S46). This considerably reduces the initial pull-in time at next power-on.

FIG. 8 shows the gain control voltage in the operation according to the aforementioned fourth embodiment. In the fourth embodiment, when automatic gain control is intermittently performed by turning on/off the power supply of the apparatus, the initial pull-in operation at start of each automatic gain control round is performed via the procedure for the first embodiment and it is determined that the gain control voltage value g has fallen within the control value range A1 N1 times in succession. In case the convergence result of the gain control voltage value g is stable and has fallen within the control value range A1 N1 times in succession, the determination section 9 stores the median of the control value range A1 into memory. At the next power-on, the determination section 9 supplies the median of the control value range A1 as a gain control signal b to the gain control input of the variable gain amplifier 1 from the beginning to start automatic gain control.

Thus, in the fourth embodiment, in case the level of the input signal a is stable and the gain control voltage value g has fallen within the control value range A1 a predetermined number of times in succession, it is possible to reduce the initial pull-in time by using the median of the control value range A1 as a gain control voltage value for the next time.

While the first embodiment is used as the operation at the start of the primary automatic gain control via the closed loop control system in the fourth embodiment, the second embodiment or the third embodiment can be applied as well.

It is also possible to perform normal processing without sweep operation during pull-in operation of automatic gain control and to supply the median of the control value range A1 at the next power-on, when the gain control voltage value g has fallen within the control value range A1 a predetermined number of times in succession. The control value range A1 or its median is not limited to a preset fixed range or value but may vary depending on fluctuation of the gain control voltage value g.

(Fifth Embodiment)

Figure 9:
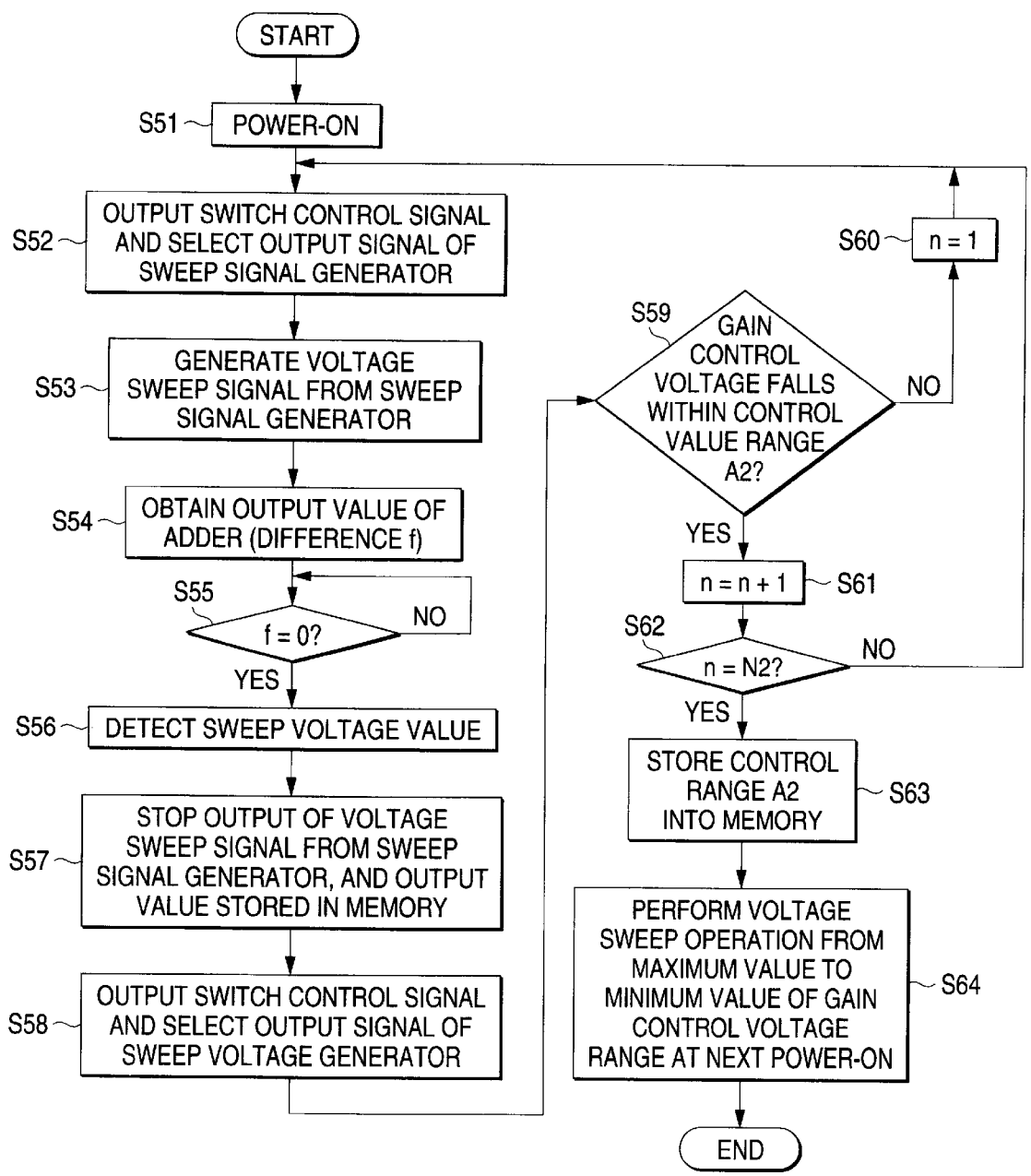
FIG. 9 is a flowchart showing the operation procedure for the fifth embodiment.
Figure 10:
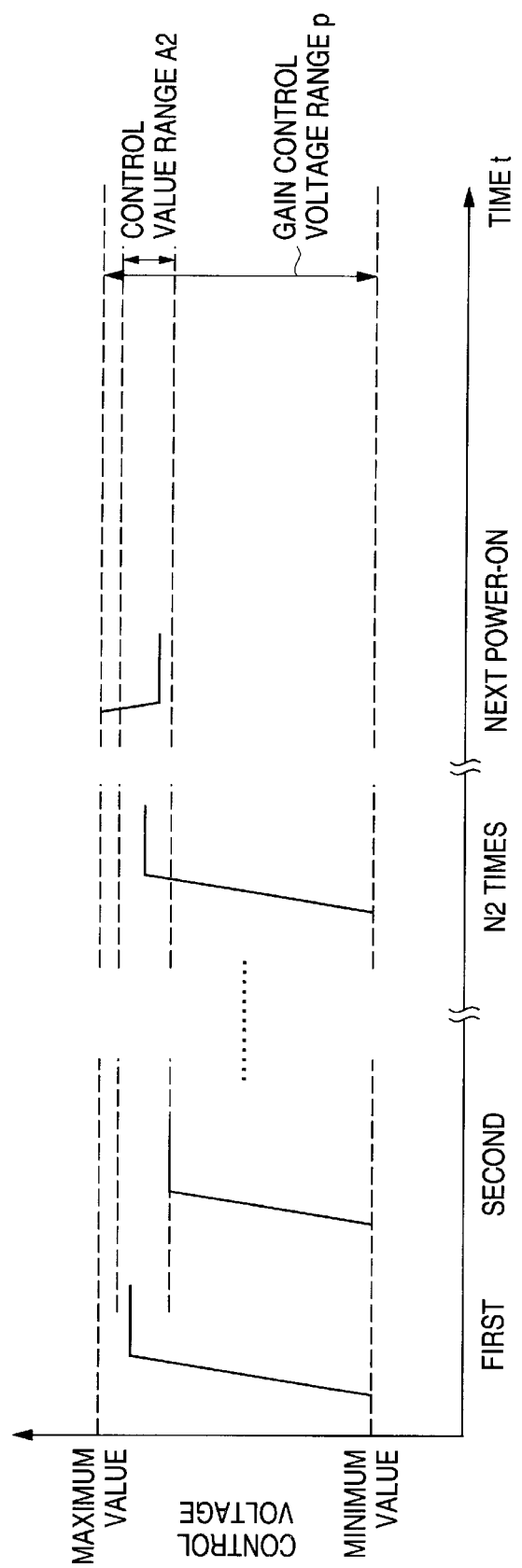
FIG. 10 is a waveform diagram showing the gain control voltage in the operation according to the fifth embodiment.

FIG. 9 is a flowchart showing the operation procedure for the fifth embodiment. FIG. 10 is a wave form diagram showing the gain control voltage in the operation according to the fifth embodiment. Configuration of the automatic gain controller is the same as that of the first embodiment shown in FIG. 1 thus the corresponding description is omitted. For operation, the difference from the first embodiment is mainly described.

In FIG. 9, the processing in steps S51 through S58 is the same as steps S11 through S18 in the second embodiment shown in FIG. 2. That is, automatic gain control is started via the same procedure as the second embodiment from power-on of the automatic gain controller until execution shifts to the primary gain control via the closed loop. The fifth embodiment shows an operation example preferable for a case where the predetermined control value range A2 is biased to one side of the gain control voltage range p. Here the case where A2 is biased to the maximum value side of the gain control voltage range p will be described.

After automatic gain control is started in step S58, the determination section 9 determines whether or not the gain control voltage value g generated by the control voltage generator 5 has fallen within the predetermined control value range A2 (step S59). This predetermined control value range A2 is set as required based on for example the gain control voltage value g obtained when the adder 4 has output f=0 in the gain control voltage range p input from the controller (not shown). Thus the predetermined control value range A2 is set in the predetermined area of the gain control voltage range p depending on the convergence value e. In this embodiment, in case the predetermined control value range A2 is biased to the opposite side of the sweep start voltage of the voltage sweep signal h, that is, the maximum value side of the gain control voltage range p, the sweep direction of the voltage sweep signal h is reversed.

In case the gain control voltage value g does not fall within the control value range A2 in step S59, execution proceeds to step S60 and sets the counter value n of the counter in the determination section 9 to n=1 then returns to step S52. Processing on the initial pull-in operation of the automatic gain control is performed again and the gain control voltage value g is determined in step 59.

In case the gain control voltage value g has fallen within the control value range A2 in step S59, the counter value n of the counter is increased by one, that is, n=n+1 (step S61) and it is determined whether or not the counter value n=N2 (step S62). In case N is not N2, that is, the gain control voltage value g as a convergence result at the start of automatic gain control is within the control value range A2 less than N2 times, execution returns to step S52 and the same processing is repeated. That is, the counter in the determination section 9 is increased when the gain control voltage value g has converged within the control value range A2 in succession. In case the gain control voltage value g is out of the control value range A2, counting restarts from n=1 again.

In case n=N2 in step S62 and the gain control voltage value g has converged within the control value range A2 N2 times in succession, this control value range A2 is stored into memory (step S63). The determination section 9 determines that the gain control voltage value g has stably fallen within the control value range A2 biased to the maximum value side in the gain control voltage range p when the gain control voltage value g as a convergence result has fallen within the predetermined voltage value A2 a predetermined number of times (N2 times) in succession while pull-in operation of the automatic gain control is intermittently being performed, and stores the control value range A2 biased to the maximum value side into memory.

At the next power-on, the determination section 9 sends an instruction to the sweep signal generator 6 to reverse the sweep direction of the voltage sweep signal h. That is, the determination section 9 instructs the sweep signal generator 6 to generate the voltage sweep signal h so that the signal may vary from the maximum value to the minimum value of the gain control voltage range p, then starts the automatic gain control processing (step S64). Via this feature, sweep operation via the voltage sweep signal h is performed from the maximum value and the difference f=0 is detected early in the control value range A2 biased to the maximum value side, thus considerably reducing the initial pull-in time.

FIG. 10 shows the gain control voltage in the operation according to the aforementioned fifth embodiment. In the fifth embodiment, when automatic gain control is intermittently performed by turning on/off the power supply of the apparatus, the initial pull-in operation at start of each automatic gain control round is performed via the procedure for the second embodiment and it is determined that the gain control voltage value g has fallen within the predetermined control value range A2 biased to the maximum value of the gain control voltage range p N2 times in succession. In case the convergence result of the gain control voltage value g is stable and has fallen within the control value range A2 N2 times in succession, the determination section 9 stores the stably converged control value range A2 biased to the maximum value side in the gain control voltage range p into memory. At the next power-on, the determination section 9 supplies the voltage sweep signal h varying from the maximum value to the minimum value of the gain control voltage range p as a gain control signal b to the gain control input of the variable gain amplifier 1 to start automatic gain control.

Thus, in the fifth embodiment, in case the gain control voltage value g has fallen within the control value range A2 a predetermined number of times in succession and the control value range A2 is biased to the maximum value opposite to the minimum value of the gain control voltage range p that is the sweep start voltage value of the voltage sweep signal h, it is possible to reduce the initial pull-in time by reversing the sweep direction of the voltage sweep signal h and starting sweep operation from the maximum value of the gain control voltage range p at the next power-on.

While the second embodiment is used as the operation at the start of the primary automatic gain control via the closed loop control system in the fifth embodiment, the third embodiment can be applied as well. The sweep direction of the voltage sweep signal h at the initial power-on, biasing of the control value range A2, and the reversed direction of sweep operation may be opposite to those in the foregoing description.

(Sixth Embodiment)

Figure 11:
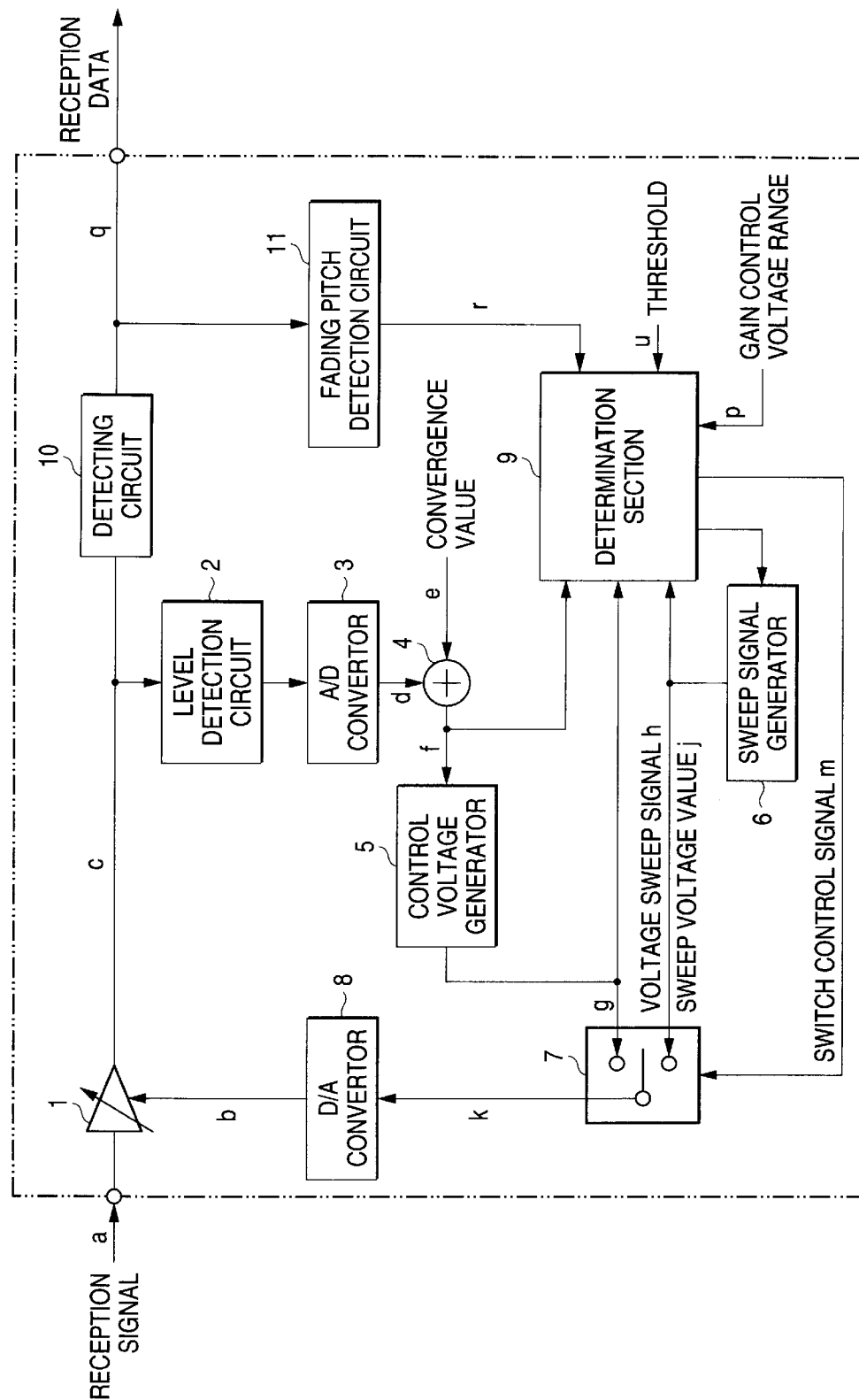
FIG. 11 is a block diagram showing the key configuration of radio communications apparatus having the automatic gain control feature according to an embodiment of the invention.

FIG. 11 is a block diagram showing the configuration of radio communications apparatus having the automatic gain control function according to an embodiment of the invention. This sixth embodiment shows a configuration example where an aforementioned embodiment is applied to radio communications apparatus for mobile communications. While the radio communications apparatus is applicable to any of a mobile station and a base station, this embodiment assumes in particular a mobile station that performs intermittent reception used in a fading environment whereby the power of the receiver is turned on/off repeatedly in relatively short intervals. Same signs are given to the same components as those in FIG. 2 and the corresponding detailed description will be omitted.

The radio gain controller of the radio communications apparatus comprises, in addition to the configuration shown in FIG. 1, a detecting circuit for detecting the output of the variable gain amplifier 1 that variably amplifies a received signal a and a fading pitch detection circuit 11 (fading pitch detector) for detecting the fading pitch of the received signal a based on the output of the detecting circuit 10. The determination section 9 according to the sixth embodiment performs, in addition to the features described in the first through fifth embodiment, operation control based on the fading pitch r output from the fading pitch detection circuit 11 and a threshold u input from the controller (not shown). The received signal a is for example an intermediate frequency (IF) signal obtained by frequency-converting a radio frequency (RF) signal.

In the foregoing configuration, a received signal c obtained by variably amplifying and making the level of the received signal a constant via the variable gain amplifier 1 based on the gain control signal b is output. The received signal c is detected by the detecting circuit 10 and output to the reception processing system (not shown) in the subsequent stage as reception data q. In the process, the fading pitch r of the reception signal a is detected from the reception data q by the fading pitch detection circuit 11 and input to the determination section 9. The determination section 9 compares the fading pitch r with the threshold u from the controller (not shown) and switches the operation of automatic gain control depending on the result of the comparison. The fading pitch detection circuit 11 may be used that of generally provided in mobile communications apparatus such as a portable telephone set of the cellular communication system (PDC: personal digital communication), and may be of any configuration as long as the circuit can detect the cycle of the level variation in the received signal caused by fading. The fading pitch detection circuit 11 may be arranged to directly input the received signal a for later detection.

Figure 12:
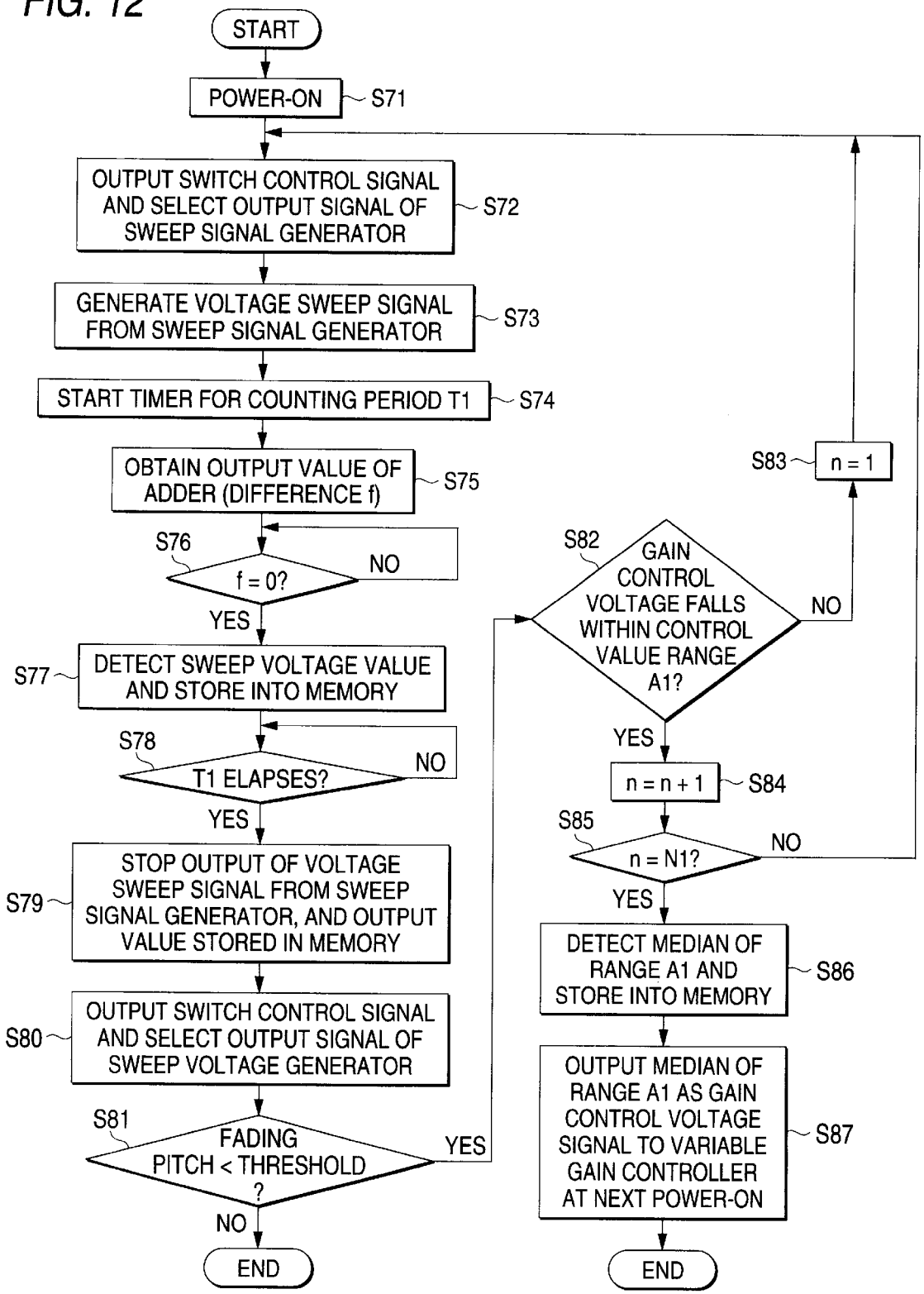
FIG. 12 is a flowchart showing the operation procedure for the sixth embodiment.

Operation of the automatic gain controller of radio communications apparatus according to the sixth embodiment will be described. FIG. 12 is a flowchart showing the operation procedure for the sixth embodiment.

In FIG. 12, the processing in steps S71 through S80 is the same as steps S1 through S10 in the first embodiment shown in FIG. 2. That is, when the automatic gain controller is powered (step S71), the determination section 9 outputs a switch control signal m to the selector switch 7 and selects the output of the sweep signal generator 6 (step S72). At the same time, the determination section 9 sends an instruction to the sweep signal generator 6 to generate a voltage sweep signal h (step S73) and starts a timer for counting a predetermined period T1 (step S74). The determination section 9 obtains the difference f that is an output value from the adder 4 (step S75) and monitors that the difference f becomes 0 (step S76).

In case f=0 in step S76, the corresponding voltage value of the voltage sweep signal h (sweep voltage value j) is detected and stored into memory (step S77). Execution enters the wait state until the period T1 has elapsed to cause time-out of the timer, that is, until the voltage sweep signal h has scanned up to the maximum value of the gain control voltage range p (step S78). When the period T1 is elapsed in step S78, an instruction is sent to the sweep signal generator 6 to stop output of the voltage sweep signal h, and the voltage value stored in memory is generated as a sweep voltage value j instead (step S79). Via this feature, the sweep voltage value j obtained when the difference f between the level detection value of the output signal c and the convergence value e is 0 is applied as a gain control signal b, instead of the voltage sweep signal h, to the gain control input of the variable gain amplifier 1. Therefore, the variable gain amplifier 1 shifts to an amplifying operation that is based on a predetermined gain control value after the elapse of the period T1.

At about the same time, the determination section 9 outputs a switch control signal m to the switch selector 7 to select the gain control voltage value g output from the control voltage generator 5 (step S80). Via this feature, the gain control voltage value g that is based on the difference f between the level detection value of the output signal c and the convergence value e is applied as a gain control signal b to the gain control input of the variable gain amplifier 1. This starts the primary automatic gain control via the closed loop control system.

In the sixth embodiment, the fading pitch r of the received signal a is detected by the fading pitch detection circuit 11 and supplied to the determination section 9 in the process of automatic gain control operation. The fading pitch q gives information used for assuming the travel velocity of a mobile station as well as the signal receiving state in the application of a mobile station of radio communications apparatus. In particular, it is determined that, the travel velocity is low when the fading pitch q (or cycle in this case) is large, and high when q is small.

The determination section 9, after shifting to automatic gain control via the closed loop control system in step S80, compares the fading pitch r with of the threshold u (step S81). While the fading pitch is determined after starting the automatic gain control in this exemplary flowchart, the fading pitch may be determined when the adder 4 has output the difference f=0.

In case the fading pitch q is greater than the threshold u in step S81, it is determined that the travel velocity is low and the signal receiving state is stable and a received signal of a substantially constant level is obtained. Thus the primary automatic gain control is started and executed. In case the fading pitch q is smaller than the threshold u, it is determined that the travel velocity is high and the signal receiving state is unstable. Thus execution proceeds to step S81 and the same processing as in steps S41 through S46 in the fourth embodiment is performed in steps S82 to S87.

The determination section 9 determines whether or not the gain control voltage value g output by the control voltage generator 5 has fallen within the predetermined control value range A1 (step S82). In case the gain control voltage value g does not fall within the control value range A1, execution proceeds to step S83 and sets the counter value n of the counter in the determination section 9 to n=1 then returns to step S72. Processing on the initial pull-in operation of the automatic gain control is performed again and the gain control voltage value g is determined in step S82. In case the gain control voltage value g has fallen within the control value range A1 in step S82, the counter value n of the counter is increased by one, that is, n=n+1 (step S84) and it is determined whether or not the counter value n=N1 (step S85). In case N is not N1, that is, the gain control voltage value g as a convergence result at the start of automatic gain control is within the control value range less than N1 times, execution returns to step S72 and the same processing is repeated. In case the gain control voltage value g is out of the control value range A1, counting restarts from n=1 again.

In case n=N1 in step S85 and the gain control voltage value g has converged within the control value range A1 N1 times in succession, the median of the control value range A1 is detected and this value is stored into memory (step S86). The determination section 9 generates the median of the control value range obtained via the foregoing procedure as a sweep voltage value j and outputs the median to the variable gain amplifier 1 as a gain control signal b (step S87).

Thus, in the sixth embodiment, in radio communications apparatus for turning on/off the power supply of the apparatus to perform intermittent reception and intermittent gain control, signal receiving state is stable in case the cycle of the fading pitch is long, thus the pull-in operation in the first embodiment is performed each time. In case the cycle of the fading pitch is short, it is determined that the gain control voltage value g as a convergence result at the start of automatic gain control is within the control value range A1 the predetermined number of times N1, and on determination thereof, the median of the control value range A1 is supplied at the next power-on.

While the first embodiment is used as the operation at the start of the primary automatic gain control via the closed loop control system in the sixth embodiment, the second embodiment or the third embodiment can be applied as well. It is also possible to perform normal pull-in processing without sweep operation during pull-in operation of automatic gain control and to count the times the gain control voltage value g has fallen within the control value range A1 only in case the cycle of the fading pitch is short, and to supply the median of the control value range A1 at the next power-on, when the gain control voltage value g has fallen within the control value range A1 a predetermined number of times in succession. It is also possible to switch the operation of supplying the gain control voltage value at the next power-on depending on the length of the cycle of the fading pitch alone, without counting the times the gain control voltage value g has fallen within the control value range A1. In this case, the gain control voltage value may be set as required considering the convergence value e.

In a mobile station of radio communications apparatus, operation control is performed where the power-on cycle of the intermittent reception is extended based on the determination that the travel velocity is low in case the cycle of the fading pitch is long and is reduced based on the determination that the travel velocity is high in case the cycle of the fading pitch is short. The sixth embodiment is preferable to apparatus that perform such the operation described above. In this case, in case the cycle of the fading pitch is long, that is, the cycle of the intermittent reception is long, pull-in operation is performed via sweep operation each time the apparatus is powered and automatic gain control is started and executed. In case the cycle of the fading pitch is short, that is, the cycle of the intermittent reception is short, the times the gain control voltage value g has fallen within the control value range A1 is counted and in case it is determined that the gain control voltage value g has fallen within the control value range A1 a predetermined number of times in succession, pull-in operation is performed with the median of the control value range A1 supplied each time the apparatus is powered and automatic gain control is started and executed in the subsequent intermittent reception.

In this way, according to the sixth embodiment, it is possible to perform pull-in operation of proper automatic gain control depending on the signal receiving state of radio communications apparatus in the fading environment. Via this feature, it is possible to reduce the initial pull-in time As mentioned earlier, the invention has an effect that it is possible to provide an automatic gain controller and an automatic gain control method for reducing the initial pull-in time at power-on, and radio communications apparatus equipped with the automatic gain control function.

What is claimed is:

1. An automatic gain controller comprising:
a gain control amplifier which variably amplifies an input signal based on a gain control signal to output a signal of a predetermined level;
a gain control signal generator which generates an automatic gain control signal based on the difference between the level of the output signal from the variable gain amplifier and a target value;
a sweep signal generator which outputs a sweep signal for sweeping across the minimum value and the maximum value of a variable gain range of the variable gain amplifier;
a gain voltage value detector which detects a control voltage value of the sweep signal obtained when the level of the output signal from the variable gain amplifier coincides with the target value; and
a gain control signal provider which provides the gain control signal to the variable gain amplifier,
wherein the sweep signal is used as the gain control signal in the initial stage of operation,
wherein the control voltage value obtained when the level of the output signal coincides with the target value is used as the gain control signal after the sweep operation via the sweep signal,
wherein the automatic gain control signal based on the difference is used as the gain control signal after output of the control voltage value.

2. An automatic gain controller according to claim 1, wherein the gain control signal provider decides a completion of the sweep operation when the sweep signal traverses across one and the other of the minimum value and the maximum value in the variable gain range, and outputs the control voltage value as the gain control signal on completion of the sweep operation.

3. An automatic gain controller according to claim 1, wherein the gain control signal provider stops the sweep operation when the level of the output signal coincides with the target value, and outputs the control voltage value as the gain control signal on stoppage of the sweep operation.

4. An automatic gain controller according to claim 1, further comprising start operation controller which determines that the control voltage value of the sweep signal obtained when the level of the output signal coincides with the target value falls within a predetermined control value range in the variable gain range of the variable gain amplifier, and provides the median of the control value range as the gain control signal to the variable gain amplifier at the start of the next operation when the control voltage value falls within the control value range a predetermined number of times in succession.

5. An automatic gain controller according to claim 1, further comprising a sweep controller which determines that the control voltage value of the sweep signal obtained when the level of the output signal coincides with the target value is biased to one side of the variable gain range of the variable gain amplifier, and performing sweep operation in the direction opposite to the sweep direction of the sweep signal at the start of the next operation when the control voltage value falls within this biased control value range a predetermined number of times in succession.

6. An automatic gain control method for variably amplifying an input signal based on a gain control signal via the variable gain amplifier to output a signal of a predetermined level, the automatic gain control method comprising:
a sweep signal providing step for providing a sweep signal that sweeps across the minimum value and the maximum value of the variable gain range of the variable gain amplifier in the initial stage of operation;
a control voltage value providing step for detecting the control voltage value of the sweep signal obtained when the level of the output signal of the variable gain amplifier coincides with a target value and providing the control voltage value after the sweep operation via the sweep signal; and
an automatic gain control signal supplying step for generating an automatic gain control signal based on the difference between the level of the output signal of the variable gain amplifier and the target value, and providing the automatic gain control signal after output of the control voltage value.

7. An automatic gain control method according to claim 6, wherein the sweep signal providing step decides completion of the sweep operation when the sweep signal traverses across one and the other of the minimum value and the maximum value in the variable gain range, and outputs the control voltage value as the control voltage value supplying step.

8. An automatic gain control method according to claim 6, wherein the sweep signal providing step stops the sweep operation when the level of the output signal coincides with the target value, and provides the control voltage value as the control voltage value providing step on stoppage of the sweep operation.

9. An automatic gain control method according to claim 6, further comprising a start operation control step for determining that the control voltage value of the sweep signal obtained when the level of the output signal coincides with the target value falls within a predetermined control value range in the variable gain range of the variable gain amplifier, and providing the median of the control value range as the gain control signal to the variable gain amplifier at the start of the next operation when the control voltage value falls within this control value range a predetermined number of times in succession.

10. An automatic gain control method according to claim 6, further comprising a sweep control step for determining that the control voltage value of the sweep signal obtained when the level of the output signal coincides with the target value is biased to one side of the variable gain range of the variable gain amplifier, and performing sweep operation in the direction opposite to the sweep direction of the sweep signal at the start of the next operation when the control voltage value falls within this biased control value range a predetermined number of times in succession.

11. A radio communications apparatus having an automatic gain control function for variably amplifying an input signal based on a gain control signal via the variable gain amplifier to output a signal of a predetermined level, the radio communications apparatus comprising:
a gain control signal generator which generates an automatic gain control signal based on the difference between the level of the output signal of the variable gain amplifier and a target value;

a sweep signal generator which outputs a sweep signal that sweeps across the minimum value and the maximum value of the variable gain range of the variable gain amplifier;

a gain voltage value detector which detects the control voltage value of the sweep signal obtained when the level of the output signal coincides with the target value; and a gain control signal provider which provides a gain control signal to the variable gain amplifier, wherein the sweep signal is used as the gain control signal in the initial stage of operation, wherein the control voltage value obtained when the level of the output signal coincides with the target value is used as the gain control signal after the sweep operation via the sweep signal, wherein the automatic gain control signal based on the difference is used as the gain control signal after output of the control voltage value.

12. A radio communications apparatus according to claim 11, further comprising:

a fading pitch detector which detects the fading pitch of the input signal; and a start operation controller which determines that the control voltage value of the sweep signal obtained when the level of the output signal coincides with the target value falls within a predetermined control value range in the variable gain range of the variable gain amplifier when the cycle of the detected fading pitch is shorter than a predetermined value, and providing the median of the control value range as the gain control signal to the variable gain amplifier at the start of the next operation when the control voltage value falls within this control value range a predetermined number of times in succession.

* * * * *